(12) United States Patent
Liu et al.

(10) Patent No.: US 7,718,551 B2
(45) Date of Patent: May 18, 2010

(54) METHOD FOR FORMING PHOTORESIST LAYER

(75) Inventors: Yu-Huan Liu, Taipei County (TW); Chih-Jung Chen, Taipei (TW); Chih-Chung Huang, Hsinchu County (TW)

(73) Assignee: United MIcroelectronics Corp., Hsinchu (TW)

( * ) Notice: Subject to any disclaimer, the term of this patent is extended or adjusted under 35 U.S.C. 154(b) by 1 day.

(21) Appl. No.: 12/044,621

(22) Filed: Mar. 7, 2008

(65) Prior Publication Data

US 2009/0227120 A1 Sep. 10, 2009

(51) Int. Cl.
*H01L 21/00* (2006.01)
*H01L 21/8242* (2006.01)
*B05D 3/12* (2006.01)
*C08J 7/04* (2006.01)

(52) U.S. Cl. .................. 438/782; 438/21; 438/240; 257/E21.027; 427/240; 427/512; 430/949

(58) Field of Classification Search .................... 438/21, 438/782; 427/240
See application file for complete search history.

(56) References Cited

U.S. PATENT DOCUMENTS

| 5,658,615 | A | * | 8/1997 | Hasebe et al. | ............... 427/240 |
| 5,677,001 | A | * | 10/1997 | Wang et al. | ................. 427/240 |
| 6,784,120 | B2 | | 8/2004 | Davlin et al. | |
| 7,157,386 | B2 | | 1/2007 | Andres et al. | |

* cited by examiner

*Primary Examiner*—Savitri Mulpuri
*Assistant Examiner*—Calvin Choi
(74) *Attorney, Agent, or Firm*—J.C. Patents

(57) ABSTRACT

A method for forming a photoresist layer is provided. The method includes following steps. A wafer is provided in a semiconductor machine. The wafer is spun at a first spin speed. A pre-wet solvent is dispensed on the spinning wafer by using a nozzle disposed at a fixed position. The pre-wet solvent then stops dispensing. The spin speed of the wafer is adjusted from the first spin speed to a second spin speed which is faster than the first spin speed. Thereafter, a photoresist layer is coated on the wafer.

17 Claims, 2 Drawing Sheets

METHOD FOR FORMING PHOTORESIST LAYER

BACKGROUND OF THE INVENTION

1. Field of the Invention

The present invention relates to a method for forming a photoresist layer. More particularly, the present invention relates to a method for forming a photoresist layer, wherein a surface of a wafer is pre-wet.

2. Description of Related Art

In general, fabricating a semiconductor device includes implementing complicated processes, such as a thin film deposition process, a photolithography process, an etching process, an ion implantation process, a thermal process, and so forth. Among the above, the photolithography process is one of the most imperative processes in the entire fabrication of the semiconductor device. Specifically, three major steps involved in performing the photolithography process include photoresist coating, photo-exposure and chemical development.

Here, the photoresist adopted in the photolithography process is mainly mixed by resin, sensitizers, and solvents in a liquid state. The quality of the photoresist is closely associated with manufacturing yield and the accuracy of the manufacturing process. Here, a crucial factor determining pattern transfers lies in adhesion between the photoresist and a surface of the wafer. Whether the surface of the wafer is thoroughly and certainly covered by the photoresist is also decisive with respect to said pattern transfers.

The photoresist usually comprises resin as an adhesive, and thus the photoresist is in a form of a thick liquid. As such, a great deal of photoresist materials is required for thoroughly covering the surface of the wafer, given that the surface of the wafer is a dry surface.

To resolve said issue, a pre-wet solvent is often employed for pre-wetting the surface of the wafer according to the conventional art, such that the consumption of the photoresist material is reduced. As the pre-wet process is performed on the surface of the wafer in accordance with the conventional art, the pre-wet solvent is firstly dispensed to the wafer, and then the wafer is spun. Thereby, the pre-wet solvent is coated onto the entire wafer.

FIG. 1 is a schematic view illustrating defective microbubbles arranged in circle in a photoresist layer according to the conventional art.

Due to a difference between the time of dispensing the pre-wet solvent and the time of spinning the wafer, the pre-wet solvent dispensed on the surface of the wafer is equipped with two different wet-abilities. Referring to FIG. 1, as a photoresist layer 102 is subsequently formed on a wafer 100, the two different wet-abilities possessed by the pre-wet solvent result in different characteristics of interfaces between the photoresist and the pre-wet solvent. As such, microbubbles 104 arranged in circle are generated in the photoresist layer 102 at the interfaces between the portions equipped with the two different wet-abilities of the pre-wet solvent, generating defects in the photoresist layer 102.

SUMMARY OF THE INVENTION

In light of the foregoing, the present invention is directed to a method for forming a photoresist layer. The method is capable of preventing defects from being generated in the photoresist layer.

The present invention is further directed to a method for forming the photoresist layer. The method is able to reduce consumption of photoresist materials in an effective manner.

The present invention provides a method for forming a photoresist layer. The method includes following steps. A wafer is provided in a semiconductor machine at first. The wafer is then spun at a first spin speed. Thereafter, a pre-wet solvent is dispensed on the spinning wafer by using a nozzle disposed at a fixed position. The pre-wet solvent then stops dispensing. Afterwards, the spin speed of the wafer is adjusted from the first spin speed to a second spin speed, and the second spin speed is faster than the first spin speed. Next, a photoresist layer is coated on the wafer.

According to an embodiment of the present invention, the semiconductor machine includes a photoresist coating machine.

According to an embodiment of the present invention, the first spin speed ranges from 20 rpm to 1000 rpm.

According to an embodiment of the present invention, the fixed position includes a position over a central portion of the wafer.

According to an embodiment of the present invention, the pre-wet solvent includes a reducing resist consumption (RRC) solvent.

According to an embodiment of the present invention, the second spin speed ranges from 20 rpm to 1000 rpm.

According to an embodiment of the present invention, the step of adjusting the first spin speed to the second spin speed includes adjusting the first spin speed to a third spin speed and then adjusting the third spin speed to the second spin speed.

According to an embodiment of the present invention, the third spin speed is slower than the first spin speed.

According to an embodiment of the present invention, the third spin speed is faster than the first spin speed but slower than the second spin speed.

According to an embodiment of the present invention, the third spin speed ranges from 20 rpm to 1000 rpm.

According to an embodiment of the present invention, the step of dispensing the pre-wet solvent on the spinning wafer includes implementing the step after the wafer is spun but before the spin speed of the wafer reaches the first spin speed.

According to an embodiment of the present invention, the step of dispensing the pre-wet solvent on the spinning wafer includes implementing the step at the time when the spin speed of the wafer reaches the first spin speed.

According to an embodiment of the present invention, the step of dispensing the pre-wet solvent on the spinning wafer includes implementing the step at the time when the wafer is spun.

The present invention further provides a method for forming a photoresist layer. The method includes following steps. A wafer is provided in a semiconductor machine at first. The wafer is then spun at a predetermined spin speed. Thereafter, a pre-wet solvent is dispensed on the spinning wafer by using a nozzle disposed at a fixed position. Next, the pre-wet solvent stops dispensing. Afterwards, a photoresist layer is coated on the wafer.

According to another embodiment of the present invention, the predetermined spin speed ranges from 20 rpm to 1000 rpm.

According to another embodiment of the present invention, the fixed position includes a position over a central portion of the wafer.

According to another embodiment of the present invention, the pre-wet solvent includes an RRC solvent.

According to another embodiment of the present invention, the step of dispensing the pre-wet solvent on the spinning wafer includes implementing the step after the wafer is spun but before the spin speed of the wafer reaches the predetermined spin speed.

According to another embodiment of the present invention, the step of dispensing the pre-wet solvent on the spinning wafer includes implementing the step at the time when the spin speed of the wafer reaches the predetermined spin speed.

According to another embodiment of the present invention, the step of dispensing the pre-wet solvent on the spinning wafer includes implementing the step at the time when the wafer is spun.

Based on the above, the pre-wet solvent is dispensed on the spinning wafer according to the method for forming the photoresist layer of the present invention. Thereby, the pre-wet solvent dispensed on the entire wafer possesses the uniform wet-ability, and the characteristics of the interfaces between the pre-wet solvent and the photoresist on the entire wafer are consistent as well. As such, the micro-bubbles arranged in circle are not formed in the photoresist layer, and thus the quality photoresist layer can be constructed. In addition, prior to the formation of the photoresist layer on the wafer, the pre-wet solvent is dispensed on the wafer for pre-wetting the surface of the wafer, so as to effectively reduce the consumption of the photoresist materials.

On the other hand, as the pre-wet solvent is disposed on the wafer at two or more spin speeds, the uniformity of the pre-wet solvent on the wafer can be further improved.

In order to the make the aforementioned and other objects, features and advantages of the present invention comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
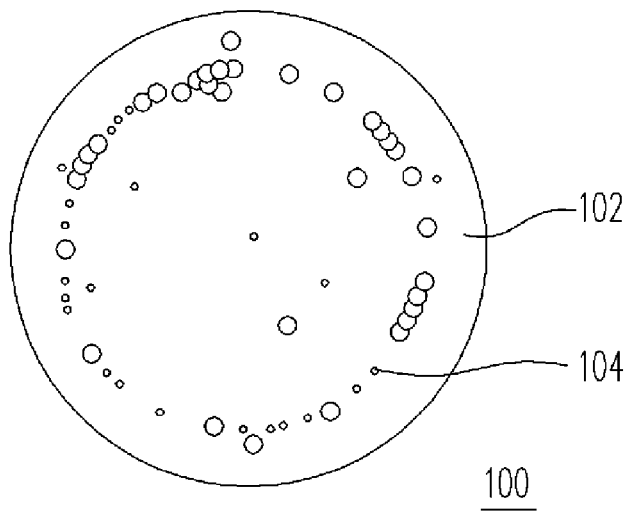
FIG. 1 is a schematic view illustrating defective micro-bubbles arranged in circle in a photoresist layer according to the conventional art.
Figure 2:
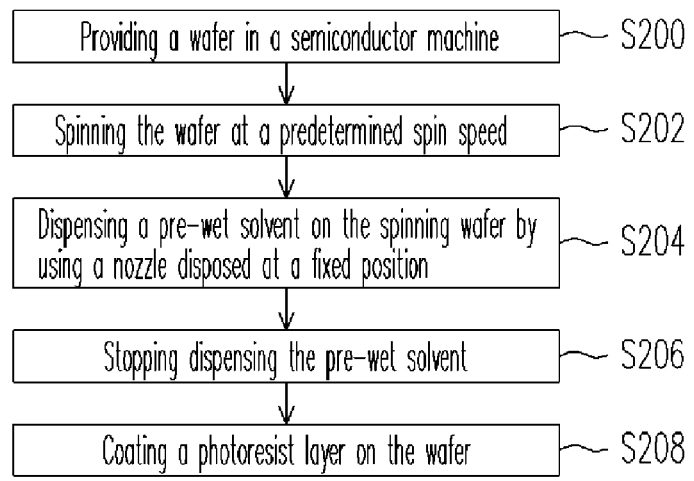
FIG. 2 is a flowchart illustrating a method for forming a photoresist layer according to a first embodiment of the present invention.

FIG. 2 is a flowchart illustrating a method for forming a photoresist layer according to a first embodiment of the present invention.

Referring to FIG. 2, first of all, a wafer is provided in a semiconductor machine in step S200. The semiconductor machine is, for example, a photoresist coating machine.

The wafer is then spun at a predetermined spin speed in step S202. The predetermined spin speed ranges from 20 rpm to 1000 rpm, for example.

Thereafter, in step S204, a pre-wet solvent is dispensed on the spinning wafer by using a nozzle disposed at a fixed position. The pre-wet solvent moistens a surface of the wafer for diminishing the surface tension between photoresist materials and the surface of the wafer. Further, the consumption of the photoresist materials is reduced as well. The pre-wet solvent is, for example, an RRC solvent. The fixed position is, for example, a position over a central portion of the wafer.

In the first embodiment, the step S204 is carried out posterior to the implementation of the step S202. That is to say, the pre-wet solvent is dispensed on the wafer after the wafer is spun. Here, the spin speed of the wafer either reaches the predetermined spin speed or not. Nevertheless, according to another embodiment, the step S202 can be implemented at the same time when the step S204 is performed. In other words, the step of spinning the wafer and the step of dispensing the pre-wet solvent on the wafer are carried out simultaneously.

Moreover, an amount of the pre-wet solvent dispensed on the wafer is not limited in the present invention, as long as the pre-wet solvent is uniformly coated onto the entire surface of the wafer. As a matter of fact, the required amount of the pre-wet solvent for coating the entire surface of the wafer is determined upon a flow rate of the dispensing solvent, a time period during which the solvent is dispensed, and the spin speed of the wafer. For instance, given that the spin speed of the wafer reaches 100 rpm, and that the flow rate of the dispensing solvent is 80 ml/min, only 1 second is required for dispensing the pre-wet solvent on the entire surface of the wafer. Besides, provided that the spin speed of the wafer reaches 50 rpm, and that the flow rate of the dispensing solvent is 80 ml/min, 6 seconds are required for dispensing the pre-wet solvent on the entire surface of the wafer.

Next, in step S206, the pre-wet solvent stops dispensing for fear of wasting the pre-wet solvent. Here, the pre-wet solvent has been coated onto the entire surface of the wafer.

Afterwards, in step S208, a photoresist layer is coated on the wafer. The method of coating the photoresist layer includes a spin coating method, for example.

As provided in the first embodiment, the pre-wet solvent is dispensed on the spinning wafer before the formation of the photoresist layer. Thereby, uniform wetness of the entire surface of the wafer contributes to equivalent characteristics of interfaces between the photoresist and the pre-wet solvent on the entire wafer. Hence, the formation of micro-bubbles arranged in circle in the photoresist layer is prevented, thus fabricating the quality photoresist layer. In addition, before the formation of the photoresist layer on the wafer, the pre-wet solvent is dispensed for pre-wetting the surface of the wafer, so as to effectively reduce the consumption of the photoresist materials.

Figure 3:
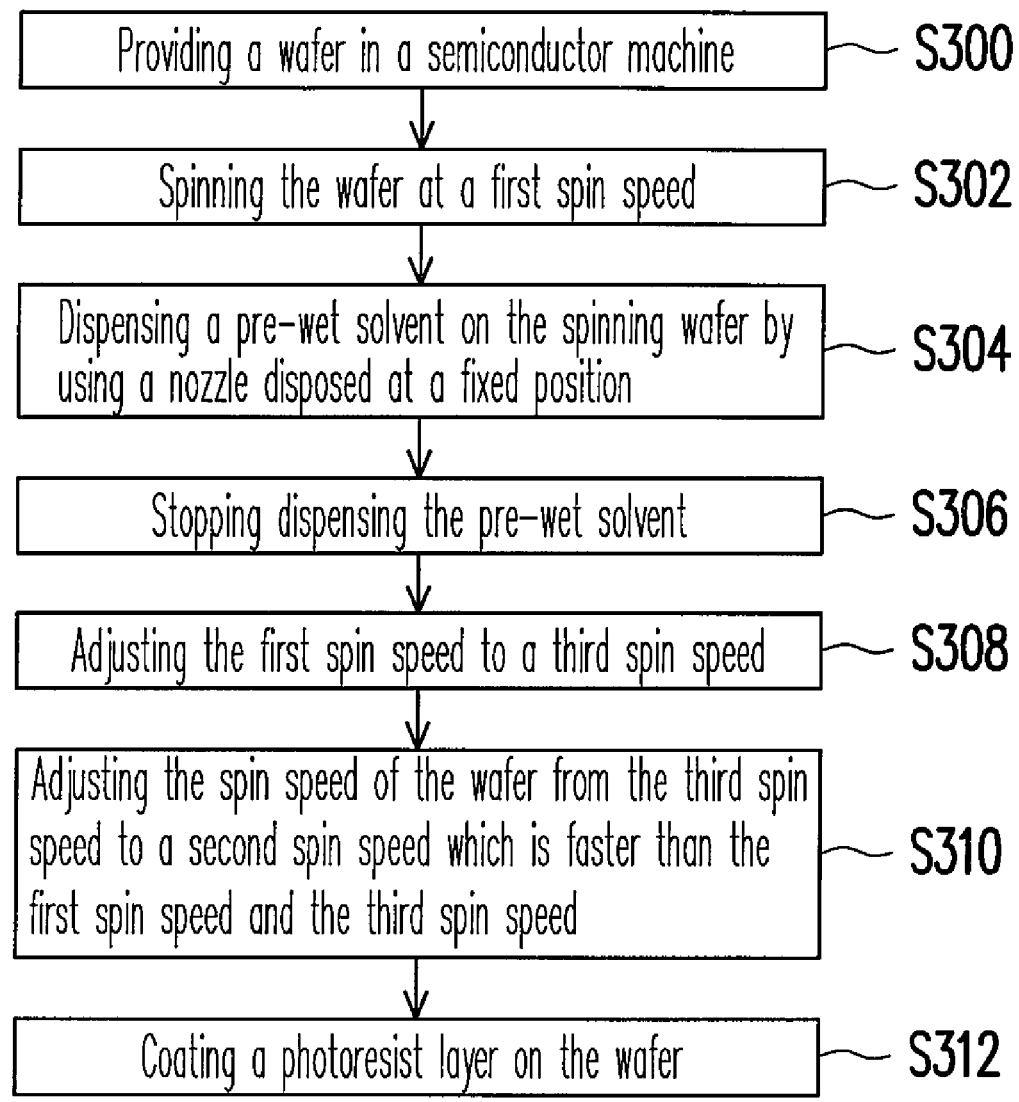
FIG. 3 is a flowchart illustrating a method for forming a photoresist layer according to a second embodiment of the present invention.

FIG. 3 is a flowchart illustrating a method for forming a photoresist layer according to a second embodiment of the present invention.

Referring to FIG. 3, first of all, a wafer is provided in a semiconductor machine in step S300. The semiconductor machine is, for example, a photoresist coating machine.

The wafer is then spun at a first spin speed in step S302. The first spin speed ranges from 20 rpm to 1000 rpm, for example.

Thereafter, in step S304, a pre-wet solvent is dispensed on the spinning wafer by using a nozzle disposed at a fixed position. The pre-wet solvent moistens a surface of the wafer for diminishing the surface tension between the photoresist materials and the surface of the wafer. Further, the consumption of the photoresist materials is reduced as well. The pre-wet solvent is, for example, an RRC solvent. The fixed position is, for example, a position over a central portion of the wafer.

In the second embodiment, the step S304 is carried out posterior to the implementation of the step S302. That is to say, the pre-wet solvent is dispensed on the wafer after the wafer is spun. Here, the spin speed of the wafer either reaches the first spin speed or not. Nevertheless, according to another embodiment, the step S302 can be implemented at the same time when the step S304 is performed. In other words, the step of spinning the wafer and the step of dispensing the pre-wet solvent on the wafer are carried out simultaneously.

Moreover, an amount of the pre-wet solvent dispensed on the wafer is not limited in the present invention, as long as the pre-wet solvent is uniformly coated onto the entire surface of the wafer. As a matter of fact, the required amount of the pre-wet solvent for coating the entire surface of the wafer is determined upon a flow rate of the dispensing solvent, a time period during which the solvent is dispensed, and the spin speed of the wafer. For instance, given that the spin speed of the wafer reaches 100 rpm, and that the flow rate of the dispensing solvent is 80 ml/min, only 1 second is required for dispensing the pre-wet solvent on the entire surface of the wafer. Besides, provided that the spin speed of the wafer reaches 50 rpm, and that the flow rate of the dispensing solvent is 80 ml/min, 6 seconds are required for dispensing the pre-wet solvent on the entire surface of the wafer.

Next, in step S306, the pre-wet solvent stops dispensing for fear of wasting the pre-wet solvent.

Thereafter, step S308 is selectively carried out by adjusting the first spin speed to a third spin speed. The third spin speed is slower or faster than the first spin speed. The difference between the third spin speed and the first spin speed results in different centrifugal forces exerted to the pre-wet solvent on the wafer, such that the pre-wet solvent is evenly dispensed on the wafer. The third spin speed ranges from 20 rpm to 1000 rpm, for example.

Next, in step S310, the spin speed of the wafer is adjusted from the third spin speed to a second spin speed which is faster than the first-spin speed and the third spin speed. Provided that the step S308 is omitted, the spin speed of the wafer is directly adjusted from the first spin speed to the second spin speed which is faster than the first spin speed. The second spin speed ranges from 20 rpm to 1000 rpm, for example.

In the step S310, the adjustment of the spin speed of the wafer up to the second spin speed also gives rise to a different centrifugal force exerted to the pre-wet solvent on the wafer, so as to evenly dispense the pre-wet solvent on the wafer. In addition, by virtue of the relatively fast second spin speed, an excessive pre-wet solvent can be further removed from the wafer, which is conducive to the formation of the photoresist layer in subsequent processes. Here, the pre-wet solvent has been coated onto the entire surface of the wafer.

Afterwards, in step S312, a photoresist layer is coated on the wafer. The method of coating the photoresist layer includes a spin coating method, for example.

According to the aforesaid first and second embodiments, the pre-wet solvent is dispensed on the spinning wafer prior to the formation of the photoresist layer, so as to pre-wet the wafer. Thereby, the consumption of the photoresist material is reduced in an effective manner, and defects generated in the photoresist layer are also avoided.

On the other hand, as the pre-wet solvent is dispensed on the wafer at two or more spin speeds, the uniformity of the pre-wet solvent on the wafer is further improved.

In addition, by virtue of the relatively fast spin speed of the wafer, the excessive pre-wet solvent is further removed from the wafer, contributing to the formation of the photoresist layer in the subsequent processes.

In summary, the above embodiments have at least the following advantages:

1. The implementation of the method for forming the photoresist layer as proposed by the present invention precludes the defects from being formed in the photoresist layer. As such, the quality photoresist layer is fabricated.

2. The consumption of the photoresist material is reduced in an effective manner by carrying out the method for forming the photoresist layer as proposed by the present invention.

3. In the method for forming the photoresist layer as proposed by the present invention, the uniformity of the pre-wet solvent on the wafer is boosted when the pre-wet solvent is dispensed at two or more spin speeds.

4. By way of spinning the wafer at a higher spin speed according to the method for forming the photoresist layer as proposed by the present invention, the excessive pre-wet solvent on the wafer is removed from the wafer due to the centrifugal force generated by the spinning operation, which is conducive to the formation of the photoresist layer in the subsequent processes.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method for forming a photoresist layer, comprising:
   providing a wafer in a semiconductor machine;
   spinning the wafer at a first spin speed;
   dispensing a pre-wet solvent on the spinning wafer by using a nozzle disposed at a fixed position;
   stopping dispensing the pre-wet solvent;
   adjusting the spin speed of the wafer from the first spin speed to a second spin speed, consisting of adjusting the first spin speed to a third spin speed and then adjusting the third spin speed to the second spin speed, the second spin speed being faster than the first spin speed, the third spin speed being slower or faster than the first spin speed and the third spin speed being slower than the second spin speed; and
   coating a photoresist layer on the wafer.

2. The method as claimed in claim 1, wherein the semiconductor machine comprises a photoresist coating machine.

3. The method as claimed in claim 1, wherein the first spin speed ranges from 20 rpm to 1000 rpm.

4. The method as claimed in claim 1, wherein the fixed position comprises a position over a central portion of the wafer.

5. The method as claimed in claim 1, wherein the pre-wet solvent comprises a reducing resist consumption solvent.

6. The method as claimed in claim 1, wherein the second spin speed ranges from 20 rpm to 1000 rpm.

7. The method as claimed in claim 1, wherein the third spin speed ranges from 20 rpm to 1000 rpm.

8. The method as claimed in claim 1, wherein the step of dispensing the pre-wet solvent on the spinning wafer comprises implementing the step after the wafer is spun but before the spin speed of the wafer reaches the first spin speed.

9. The method as claimed in claim 1, wherein the step of dispensing the pre-wet solvent on the spinning wafer comprises implementing the step at the time when the spin speed of the wafer reaches the first spin speed.

10. The method as claimed in claim 1, wherein the step of dispensing the pre-wet solvent on the spinning wafer comprises implementing the step at the time when the wafer is spun.

11. A method for forming a photoresist layer, comprising:
    providing a wafer in a semiconductor machine;
    spinning the wafer at a predetermined spin speed;
    dispensing a pre-wet solvent on the spinning wafer by using a nozzle disposed at a fixed position; and stopping dispensing the pre-wet solvent directly followed by coating a photoresist layer on the wafer.

12. The method as claimed in claim 11, wherein the predetermined spin speed ranges from 20 rpm to 1000 rpm.

13. The method as claimed in claim 11, wherein the fixed position comprises a position over a central portion of the wafer.

14. The method as claimed in claim 11, wherein the pre-wet solvent comprises a reducing resist consumption solvent.

15. The method as claimed in claim 11, wherein the step of dispensing the pre-wet solvent on the spinning wafer comprises implementing the step after the wafer is spun but before the spin speed of the wafer reaches the predetermined spin speed.

16. The method as claimed in claim 11, wherein the step of dispensing the pre-wet solvent on the spinning wafer comprises implementing the step at the time when the spin speed of the wafer reaches the predetermined spin speed.

17. The method as claimed in claim 11, wherein the step of dispensing the pre-wet solvent on the spinning wafer comprises implementing the step at the time when the wafer is spun.

* * * * *